US011922104B2

(12) United States Patent
Saint Antonin

(10) Patent No.: US 11,922,104 B2
(45) Date of Patent: Mar. 5, 2024

(54) PREDICTING OIL GAINS DERIVED FROM HORIZONTAL SIDETRACKING OF PRODUCER WELLS USING PAST PRODUCTION PERFORMANCE, SUBSURFACE INFORMATION, AND SIDETRACK DESIGN PARAMETERS

(71) Applicant: Saudi Arabian Oil Company, Dhahran (SA)

(72) Inventor: Jose Andino Saint Antonin, Jeddah (SA)

(73) Assignee: Saudi Arabian Oil Company, Dhahran (SA)

( * ) Notice: Subject to any disclaimer, the term of this patent is extended or adjusted under 35 U.S.C. 154(b) by 479 days.

(21) Appl. No.: 17/150,487

(22) Filed: Jan. 15, 2021

(65) Prior Publication Data

US 2022/0229958 A1 Jul. 21, 2022

(51) Int. Cl.
*G06F 30/28* (2020.01)
*E21B 43/30* (2006.01)
*G06Q 50/02* (2012.01)

(52) U.S. Cl.
CPC ............ *G06F 30/28* (2020.01); *E21B 43/305* (2013.01); *G06Q 50/02* (2013.01)

(58) Field of Classification Search
CPC .... G06F 30/28; E21B 43/305; E21B 41/0035; E21B 2200/20; E21B 2200/22; E21B 43/12; G06Q 50/02
See application file for complete search history.

(56) References Cited

U.S. PATENT DOCUMENTS 10,430,725 B2 10/2019 Anderson et al.
10,699,218 B2 6/2020 Anderson et al.
(Continued)

FOREIGN PATENT DOCUMENTS

WO WO 2017117445 7/2017
WO WO 2019199723 10/2019

OTHER PUBLICATIONS

Al-Alwani et al., "Production Performance Estimation from Stimulation and Completion Parameters Using Machine Learning Approach in the Marcellus Shale," presented at the 53rd US Rock Mechanics/ Geomechanics Symposium, New York, NY, Jun. 23-26, 2019, 14 pages.

(Continued)

*Primary Examiner* — Steven W Crabb
(74) *Attorney, Agent, or Firm* — Fish & Richardson P.C.

(57) ABSTRACT

Systems and methods include a computer-implemented method for displaying incremental values of average rate variations over a cumulative time window. A subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. Using the subset of independent variables and machine learning, predicted values of dependent variables are determined including an oil gain ($\Delta Q_o$) and a water reduction ($\Delta Q_w$) associated with production of the oil well. A display specifying incremental values of average rate variations over a cumulative time window is generated in a graphical user interface. The display is based at least in part on the predicted values of dependent variables.

20 Claims, 8 Drawing Sheets

(56) References Cited

U.S. PATENT DOCUMENTS

| | | | |
|---|---|---|---|
| 2014/0067353 A1 | 3/2014 | Shelley et al. | |
| 2016/0273315 A1* | 9/2016 | Carvajal | E21B 41/0092 |
| 2017/0364795 A1* | 12/2017 | Anderson | G06N 20/10 |
| 2020/0033495 A1 | 1/2020 | Tavares | |
| 2020/0184388 A1* | 6/2020 | Webb | G06Q 10/04 |

OTHER PUBLICATIONS

Bowie, "Machine Learning applied to optimize Duvernay well performance," SPE 189823-MS, presented at the SPE Canada Unconventional Resources Conference, Calgary, Alberta, Canada, Mar. 13-14, 2018, 24 pages.

Cao et al., "Data Driven production forecasting using machine learning," SPE 180984, presented at the SPE Argentina Exploration and Production of Unconventional Resources Symposium, Buenos Aires, Argentina, Jun. 1-3, 2016, 10 pages.

Elichev et al., "Understanding Well Events with Machine Learning," SPE-196861-MS, presented at the SPE Russian Petroleum Technology Conference, Moscow, Russia, Oct. 22-24, 2019, 12 pages.

Luo et al., "Production Optimization Using Machine Learning in Bakken Shale, " URTeC 2902505, presented at the Unconventional Resources Technology Conference, Houston, Texas, Jul. 23-25, 2018, 24 pages.

Rahmanifard et al., "Well Performance Prediction in Montney Formation Using Machine Learning Approaches," presented at the Unconventional Resources Technology Conference, Austin, Texas, Jul. 20-22, 2020, 11 pages.

PCT International Search Report and Written Opinion in International Appln. No. PCT/US2022/012348, dated Apr. 7, 2022, 13 pages.

* cited by examiner

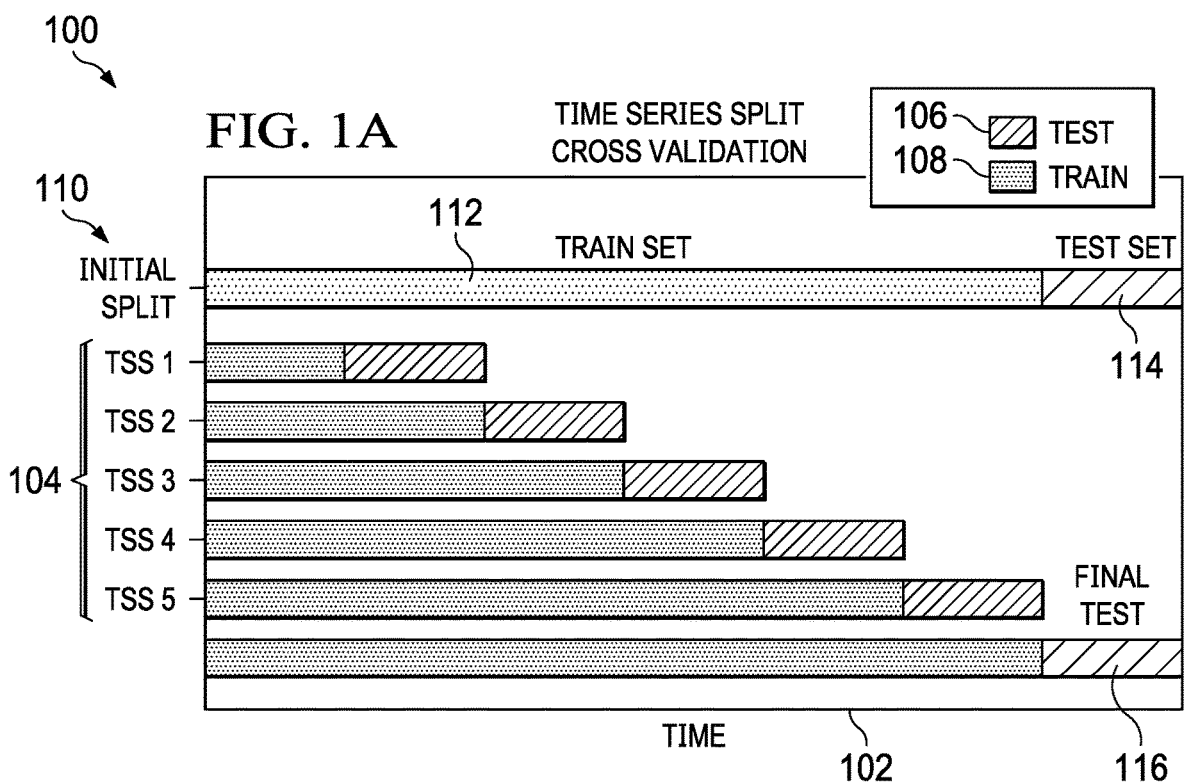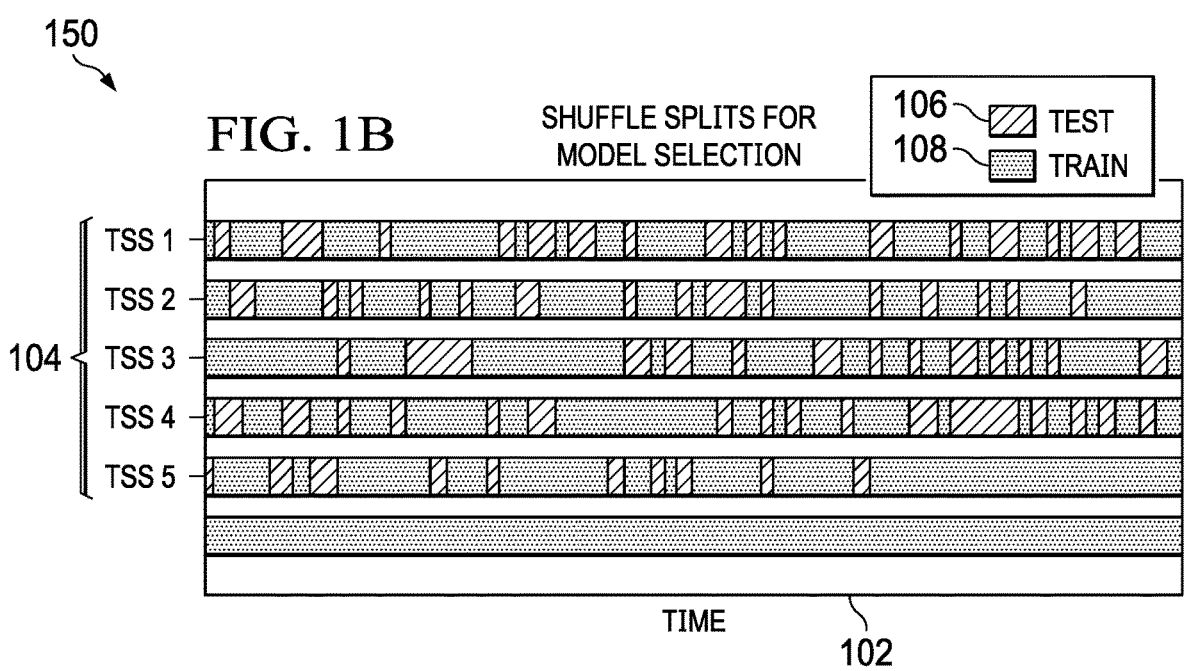

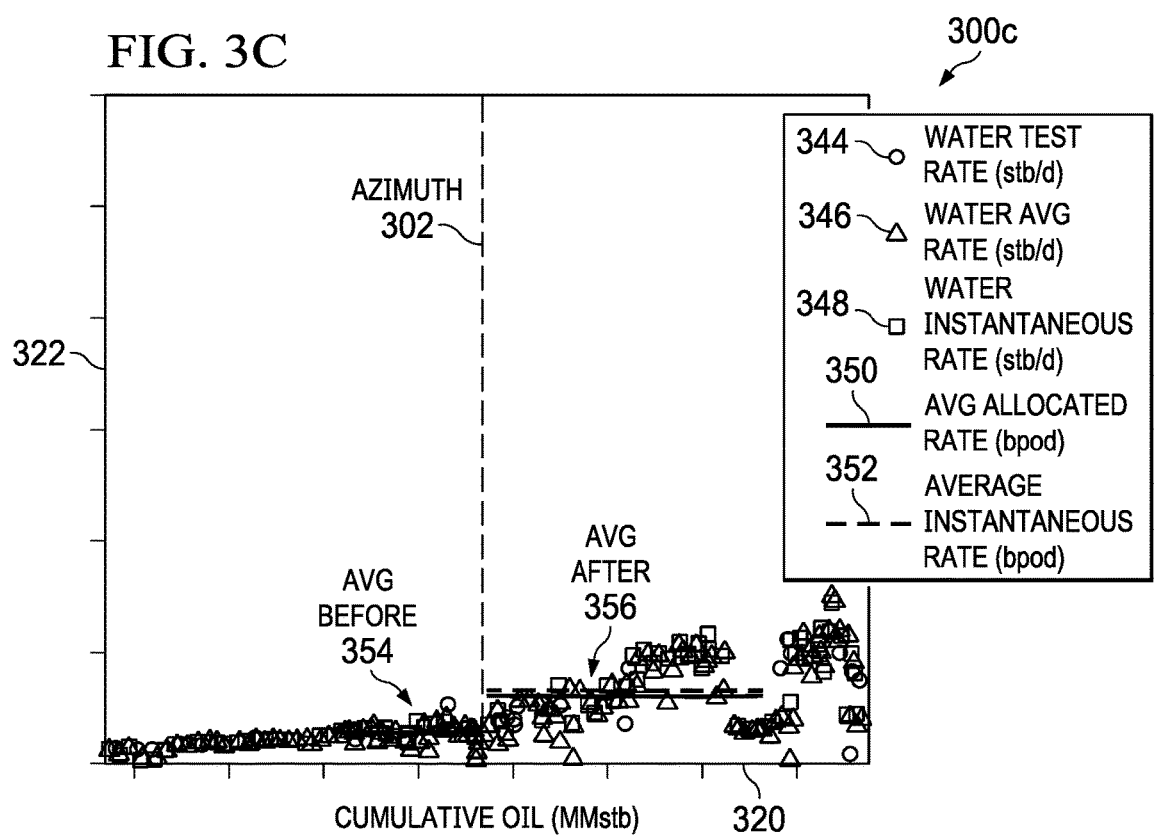
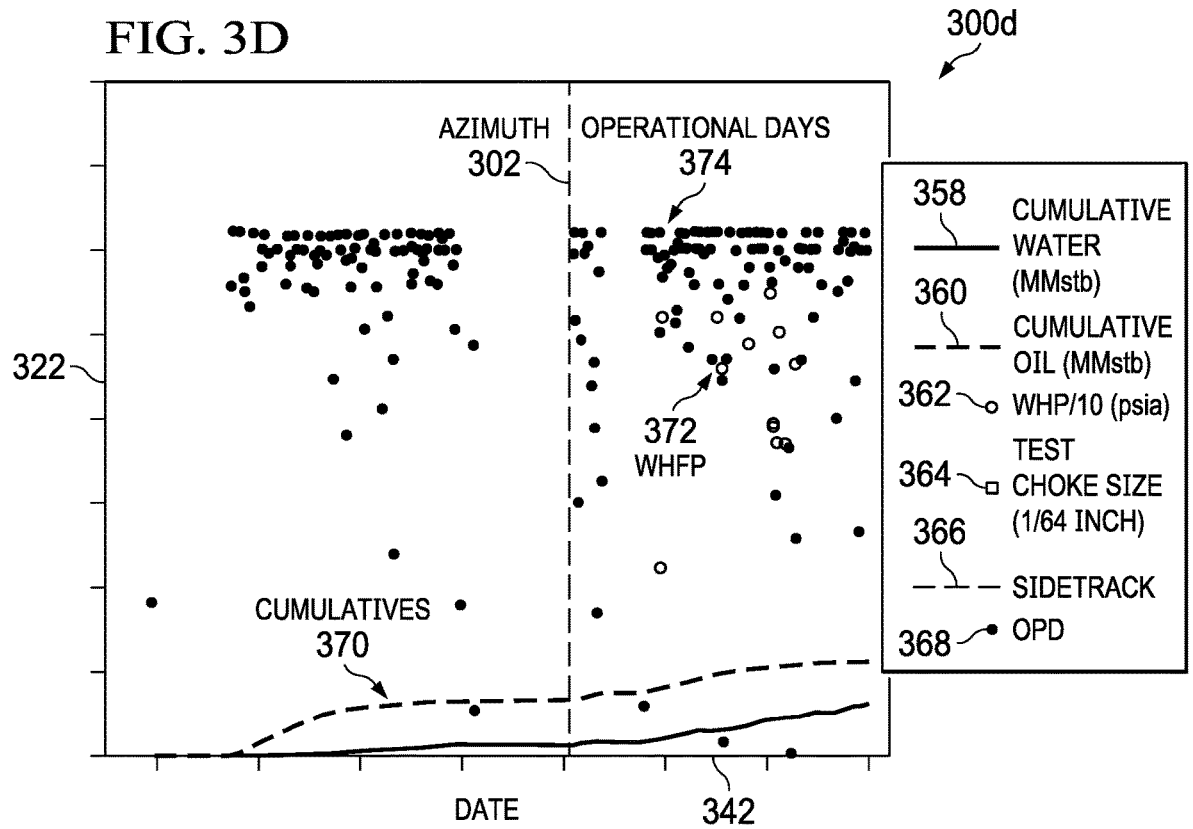

PREDICTING OIL GAINS DERIVED FROM HORIZONTAL SIDETRACKING OF PRODUCER WELLS USING PAST PRODUCTION PERFORMANCE, SUBSURFACE INFORMATION, AND SIDETRACK DESIGN PARAMETERS

BACKGROUND

The present disclosure applies to techniques used to predict oil gains derived from horizontal sidetracking of producer wells. Horizontal sidetracking allows companies to re-purpose old wells, which would otherwise be abandoned, in order to access new sections of the reservoir to further recover hydrocarbons. Prediction of horizontal sidetracking performance is customarily done using reservoir simulation or statistical analogs.

SUMMARY

The present disclosure describes techniques that can be used for techniques used to predict oil gains derived from horizontal sidetracking of producer wells using past production performance, subsurface information and sidetrack design parameters.

The present disclosure describes a workflow to extract data from historical sidetracks (for example, implemented in Python, but other programming languages can be used) and the machine learning processes validated to correctly predict sidetrack gains.

In some implementations, a computer-implemented method includes the following. A subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. Using the subset of independent variables and machine learning, predicted values of dependent variables are determined including an oil gain ($\Delta Q_o$) and a water reduction ($\Delta Q_w$) associated with production of the oil well. A display specifying incremental values of average rate variations over a cumulative time window is generated in a graphical user interface. The display is based at least in part on the predicted values of dependent variables.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/the instructions stored on the non-transitory, computer-readable medium.

The subject matter described in this specification can be implemented in particular implementations, so as to realize one or more of the following advantages. First, the techniques of the present disclosure can be used to provide statistical support for use in sidetrack decisions, including by helping to quickly and robustly evaluate sidetracks candidates, and to screen for poor candidates. Second, the techniques can reduce the need for constant drilling of sidetracks that require continuous evaluation, screening, and prediction simulation predictions that can take a significant amount of time. The techniques of the present disclosure can accelerate the process and reduce the uncertainty in the evaluation. Third, the techniques can provide a quick and unbiased prediction of sidetrack performance, including to evaluate each candidate individually. This can overcome problems that occur in which engineers have biases and limitations in the number of variables that they can consider, resulting in a loss of objectivity at the moment of assessing which sidetrack is better. Fourth, the techniques can be used to predict the performance of sidetracks (incrementally over the prior well completions) in oil fields, including water-flooded conventional reservoirs.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

FIG. 1A is a graph showing an example of a time series split validation, according to some implementations of the present disclosure.

FIG. 1B is a graph showing examples of shuffle splits for model selection, according to some implementations of the present disclosure.

FIGS. 3A-3D are plots providing examples of schematics of some of the performance features extracted automatically, according to some implementations of the present disclosure.

Like reference numbers and designations in the various drawings indicate like elements.

DETAILED DESCRIPTION

Figure 2:
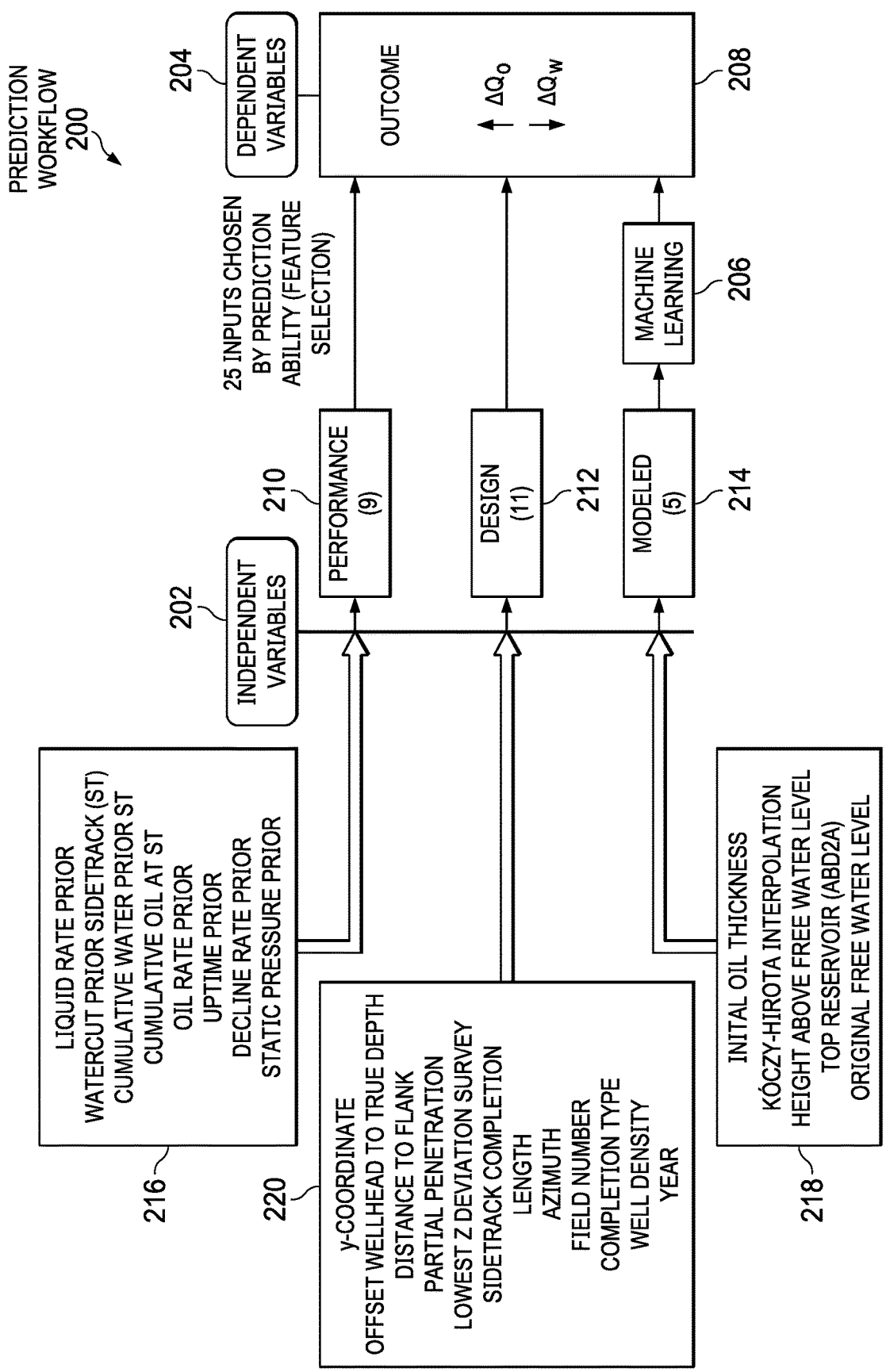
FIG. 2 is a block diagram showing an example of a workflow using predictors to predict oil gains and water reduction, according to some implementations of the present disclosure.
Figure 3A:
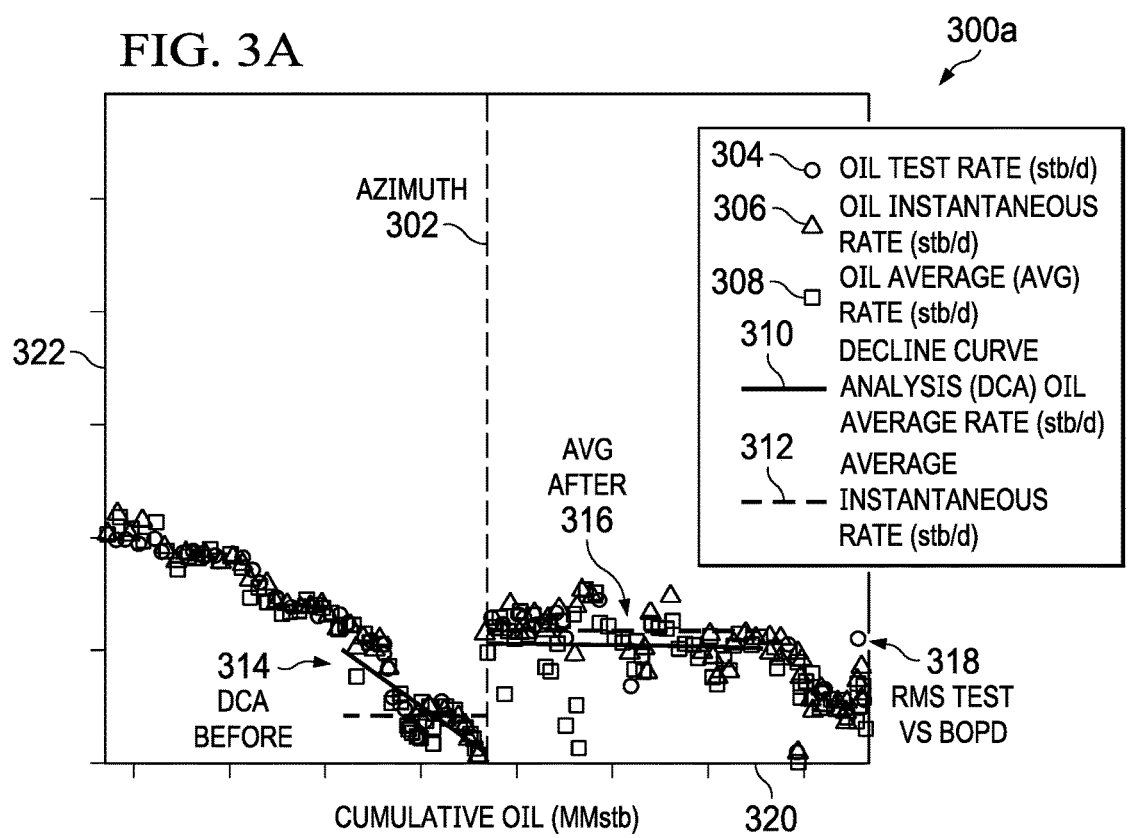
Figure 3B:
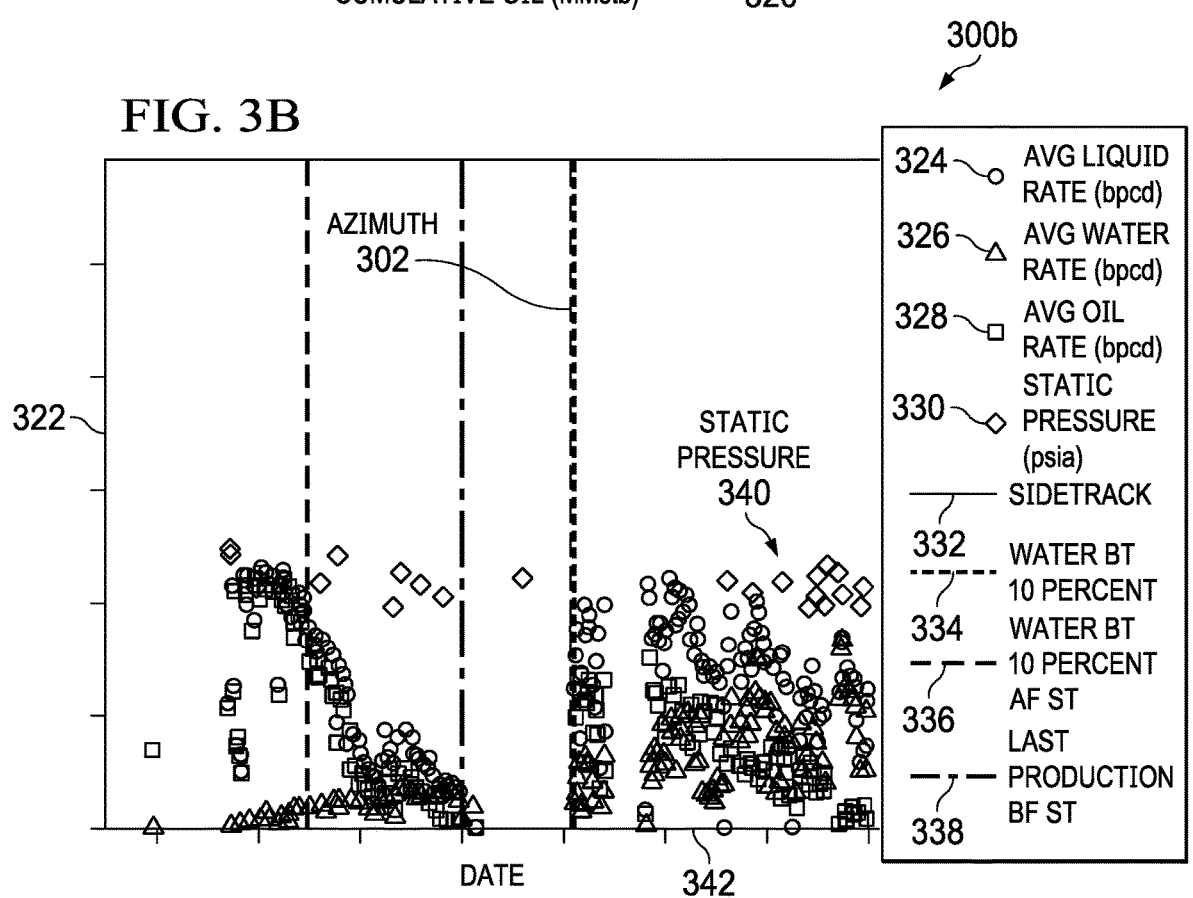

The following detailed description describes techniques used to predict oil gains derived from horizontal sidetracking of producer wells using past production performance, subsurface information, and sidetrack design parameters. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

The techniques of the present disclosure can include the use of a machine learning model and a workflow that predicts sidetrack performance (including oil gains and changes in water production) utilizing a multilayer perception (MLP) neural network. Inputs to the MLP can include a set of features (for example, 25 features) that are identified as having predictive value using feature analysis techniques. The set of features can include, for example: 1) performance data prior to the sidetrack (for example, decline rate, actual oil rate, and watercut); 2) sidetrack design information (for example, lateral length and orientation); and 3) a few modeled subsurface variables (for example, height above free water level and top structure). The techniques of the present disclosure can be implemented and deployed, for example, in specific types of reservoirs, such as high permeability giant carbonate fields. Other different types of fields/reservoirs may require alteration of certain aspects of the methodology and re-validation of the prediction ability using the MLP neural network.

The techniques of the present disclosure were used to predict sidetrack oil gains (in an unseen test set) with a correlation coefficient of 0.83. The techniques can be used to predict variations in the water rate with a correlation coefficient of 0.9. These validations can be used using random samples in historical records of sidetracks (for example, through shuffle split validation).

An additional time series validation was carried out techniques of the present disclosure for training in using information about sidetracks in the past to predict additional sidetracks. The additional time series validation also delivered very positive results. The techniques of the present disclosure can be used to evaluate, rank, and high-grade sidetrack candidates, which can result in increasing field potential and capital expenditures (CAPEX) efficiency.

The techniques of the present disclosure can include: 1) a series of workflows that generate the features (for example, used as input data) needed for the MLP neural network; and 2) a MLP neural network that receives input features about sidetracks and predicts future performance (for example, including oil and water rate).

The workflow to obtain the features can include: 1) extracting performance metrics from production allocation data; 2) providing variables related to the sidetrack design (for example, orientation and length); and 3) extracting, from geological models or logs, a limited set of subsurface attributes which have low levels of uncertainty.

The predictions can then be done as follows (assuming the predictions are applied on a new field). The MLP can be trained using a standard library (for example, Scikit Learn) to determine the best weights for the field using the historical dataset. Cross validation can be performed using shuffle split and time series cross validation. Performance of future sidetracks can then be predicted using the trained MLP model.

The techniques of the present disclosure can be useful in identifying the parameters that matter, having validated the possibility of such model being constructed. These parameters can include variables that are known prior to the drilling of the sidetrack itself (and therefore predictive) and the choke/pump setting after the sidetrack. For example, a choke setting can include a choke size post indicating a choke setting on which the sidetrack will be placed. In developing the techniques of the present disclosure, a statistical analysis that was carried out to select these variables started out with 75 parameters, from which the top 25 were selected (and are shown in FIG. 2).

FIG. 1A is a graph showing an example of a time series split validation 100, according to some implementations of the present disclosure. The graph is plotted relative to time 102 for different time series splits (TSS) 104. The graph 100 are annotated for training 108 and testing 106 sets over a time frame. The validation starts with an initial split 110, then uses a training set 112 and a testing set 114 (including at a final test 116).

FIG. 1B is a graph 150 showing examples of shuffle splits for model selection, according to some implementations of the present disclosure. The graph 150 is annotated for training 108 and testing 106 sets over a time frame relative to time and the TSSes 104.

The techniques of the present disclosure can enable fast and statistically robust evaluation of sidetracks, by simultaneously considering the effect of 25 different parameters in sidetrack performance. For example, the analysis of hundreds of sidetracks can be run to assess and rank (and predict independently) the sidetracks in a matter of minutes.

The statistical robustness is a major advantage over simple engineering judgment. It provides the capacity to remain unbiased as well as considering the impact of many conflicting variables, which is impossible for the human brain.

The advantage over standard finite different/finite volume simulation is that it is quicker and does not require input parameters which are not known well (such as the permeability fields in the reservoir).

FIG. 2 is a block diagram showing an example of a workflow 200 using predictors (or independent variables 202) to predict oil gains and water reduction, according to some implementations of the present disclosure. Dependent variables 204 can be determined using machine learning 206. The dependent variables 204 can include outcomes 208 of an oil gain ($\Delta Q_o$) and a water reduction ($\Delta Q_w$), for example. The independent variables 202 (for example, including 25 variables) can be chosen by prediction ability through feature selection, for example. In some implementations, the independent variables 202 can include nine performance variables 210, eleven design variables 212, and five modeled variables 214.

Prior parameters 216 used in the workflow 200 can include the following. A liquid rate prior can represent an average of the liquid production rate prior to the sidetrack. A watercut prior sidetrack (ST) can be calculated as a ratio of an average water production prior and an oil rate from decline curve analysis (DCA). Parameters can include a cumulative water prior to sidetrack, a cumulative oil prior to sidetrack, an oil rate prior, which is calculated using a decline curve analysis over one million stock tank barrels (MMSTB) cumulative window; an uptime prior; a choke size post indicating a choke setting on which the sidetrack will be placed; a decline rate prior (or a slope of oil DCA in MMSTB), and a static pressure prior (a trend extrapolation of static pressure to the date of sidetrack).

Other parameters 218 and 220 used in the workflow 200 can include the following. A normalized northing refers to a normalized north-south (N-S) distance relative to the centroid of the completions. For example, fields that are studied are elongated N-S, with petrophysical properties showing a variation in this direction. A Y-coordinate is represents the northing in km with origin in the barycenter of the well head locations. An offset well head (WH) to true depth (TD) can be a horizontal distance between the well head and the true depth of a new sidetrack (for example, at its tip). A distance to flank refers to the distance between the well completion center and the periphery of the field. A partial penetration refers to an extent to which the future well will penetrate vertically in the reservoir (for example, as a percentage 0-100%). A lowest z deviation (dev) survey refers to the lowest depth, in true vertical depth-subsea (TVDSS), reached by the future well completion. A start to (ST) completion length refers to the length of a completed interval. An azimuth refers to an angle measured from north in the clockwise direction (−pi/2 to pi/2). A field number refers to an integer code identifying a field. A completion type refers to an integer reflecting completion type (openhole, ICD or ICV). Well density refers to a number of other well TDs in a 2 km radius at the time of the drilling. Year refers to a year in which the sidetrack is performed. An initial oil thickness refers to the reservoir oil thickness in feet. A Kóczy-Hirota (KH) interpolation refers to a permeability height product (interpolated from maps build using interpolated pressure transient analysis (PTA) data). A height above initial free water level (HAFWL) is a height above the above free-water level. A top reservoir refers to a height in TVDSS of the top reservoir. An original free water level (FWL) refers to a TVDSS of the original free water level.

Units in input variables can be standardized. For every value, normalization (for example, subtracting the mean and dividing by the standard deviation) can be done, except the discrete variables which are one-hot encoded.

FIGS. 3A-3D are plots 300a-300d providing examples of schematics of some of the performance features extracted automatically, according to some implementations of the present disclosure. The plots 300a-300d include an azimuth line 302.

The plot 302a includes an oil test rate 304, an oil instantaneous rate 306, an oil average (avg.) rate 308, a decline curve analysis (DCA) oil average rate 310, and an average inst. 312, each rate in standard barrels per day (STB/D), for example. The plot 302a shows a DCA before point 314, an average after point 316, and a root mean square (RMS) test versus barrels of oil per day (BOPD) point 318. The plot 302a is plotted relative to cumulative (cum.) oil 320 and a rate 322.

The plot 302b includes an avg. liquid (liq.) rate 324, an avg. water (wat.) rate 326, an oil average rate 328, a static pressure 330 (for example, is pounds per square inch absolute (PSIA)), a sidetrack 332, a water breakthrough (BT) of 10 percent 334, a 10 percent after sidetrack (AF ST) 336, and a last production (prod.), and a before sidetrack (BF ST) 338. The plot 302b shows a static pressure point 340. The plot 302b is plotted relative to a date 342 and a rate 322. Rates can be in STB/D, for example.

The plot 302c includes a water test rate 344, a water avg. rate 346, a water inst. rate 348, an average inst. rate 350, and an average allocated rate 352. The plot 302c shows an average before point 354 and an average after point 356. The plot 302c is plotted relative to cumulative (cum.) oil 320 and a rate 322.

The plot 302d includes a water breakthrough (BT) cumulative water rate 358, a cumulative oil rate 360, a WHP/10 rate 362, a test choke size 364 (for example, 1/64 inch), a sidetrack 366, and operating days (OPD) 368. The plot 302d shows cumulatives 370, a well head flowing pressure (WHFP) 372, and operational days 374. The plot 302d is plotted relative to a date 342 and a rate 322.

Figure 4A:
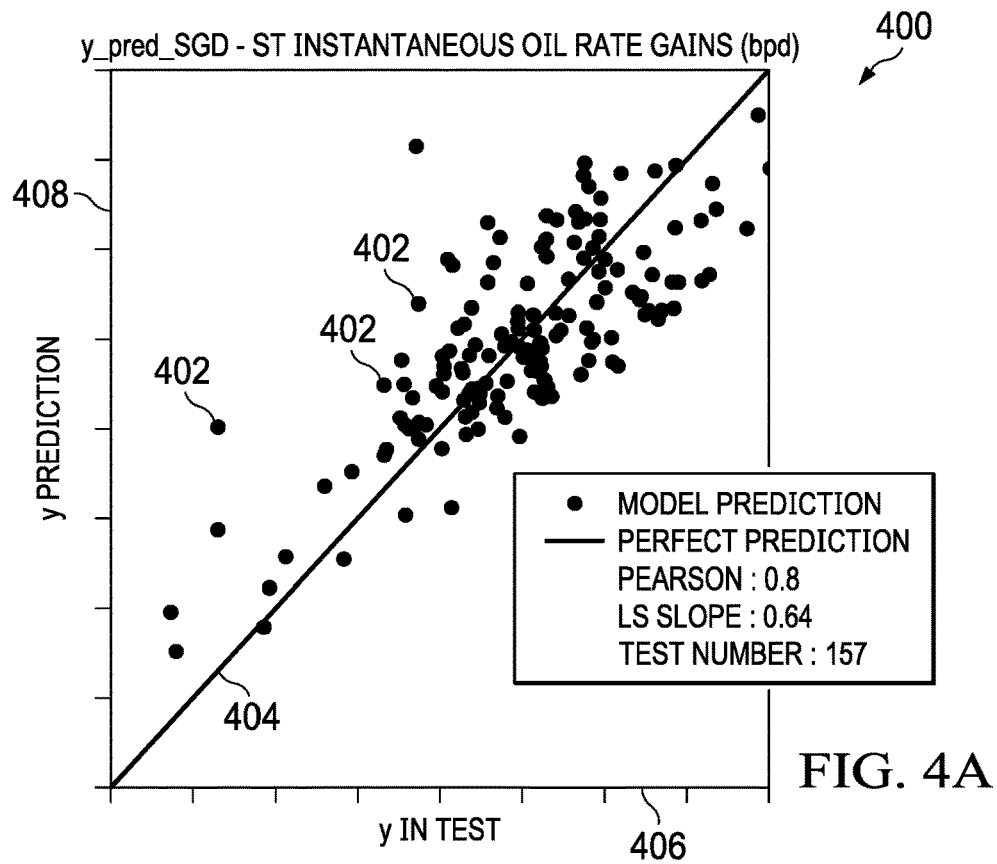
FIGS. 4A and 4B are graphs providing examples of predicted quality based on blind test for oil gains (on randomly selected samples), according to some implementations of the present disclosure.
Figure 4B:
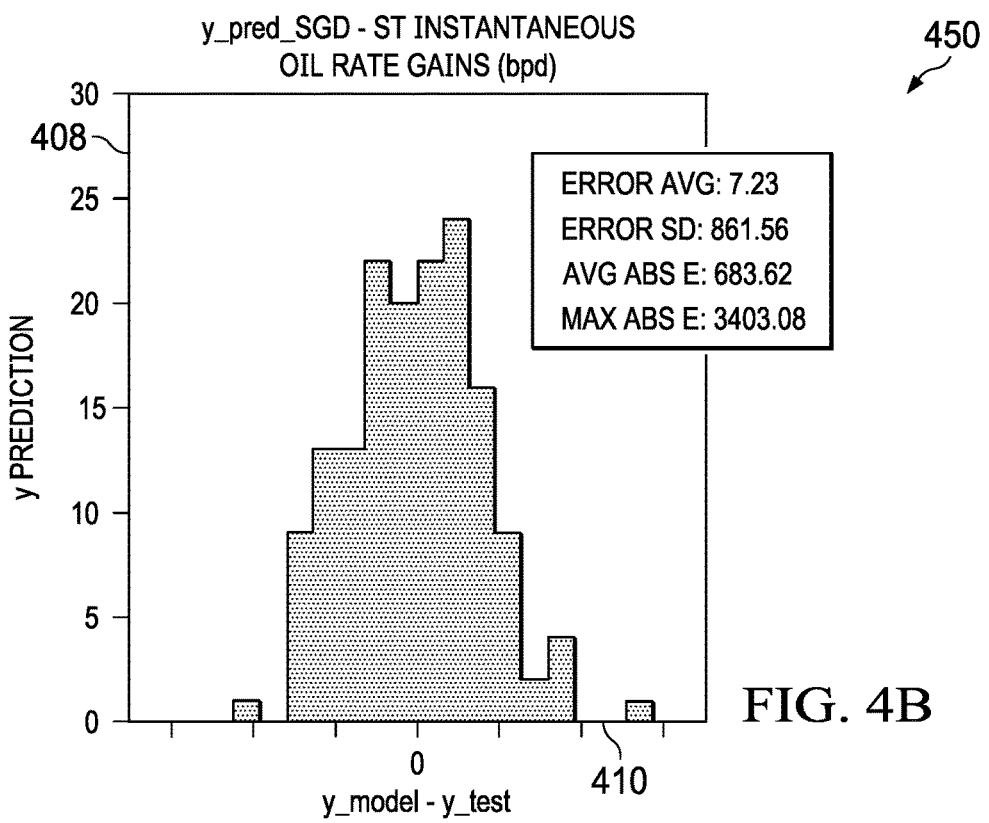

FIGS. 4A and 4B are graphs 400 and 450 providing examples of predicted quality based on blind test for oil gains (on randomly selected samples), according to some implementations of the present disclosure. For example, FIGS. 4A and 4B show validation plots, proving the statistical validity of predictions made using techniques of the present disclosure. Referring to FIG. 4A, model prediction points 402 are plotted relative to a perfect prediction line 404. The graphs are plotted relative to a "y in test" axis 406 and a y prediction 408. In the bar chart of FIG. 4B, bars representing differences 410 of y_model=y_test are graphed relative to the y_prediction axis 408.

Figure 5A:
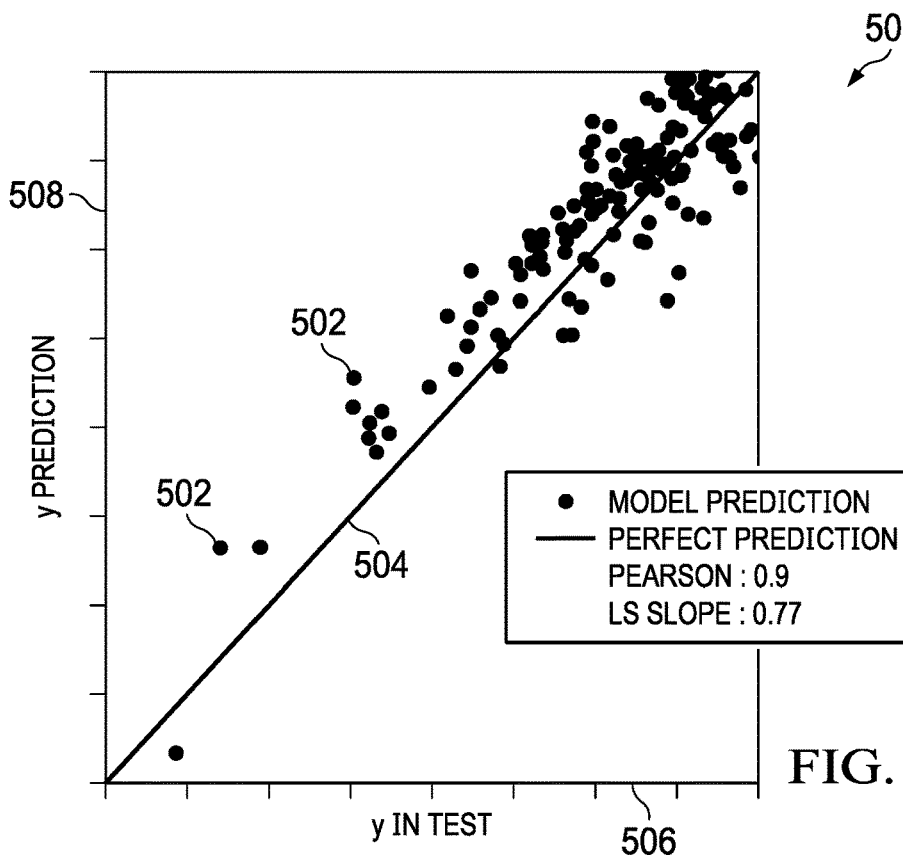
FIGS. 5A and 5B are graphs providing examples of prediction quality, according to some implementations of the present disclosure.
Figure 5B:
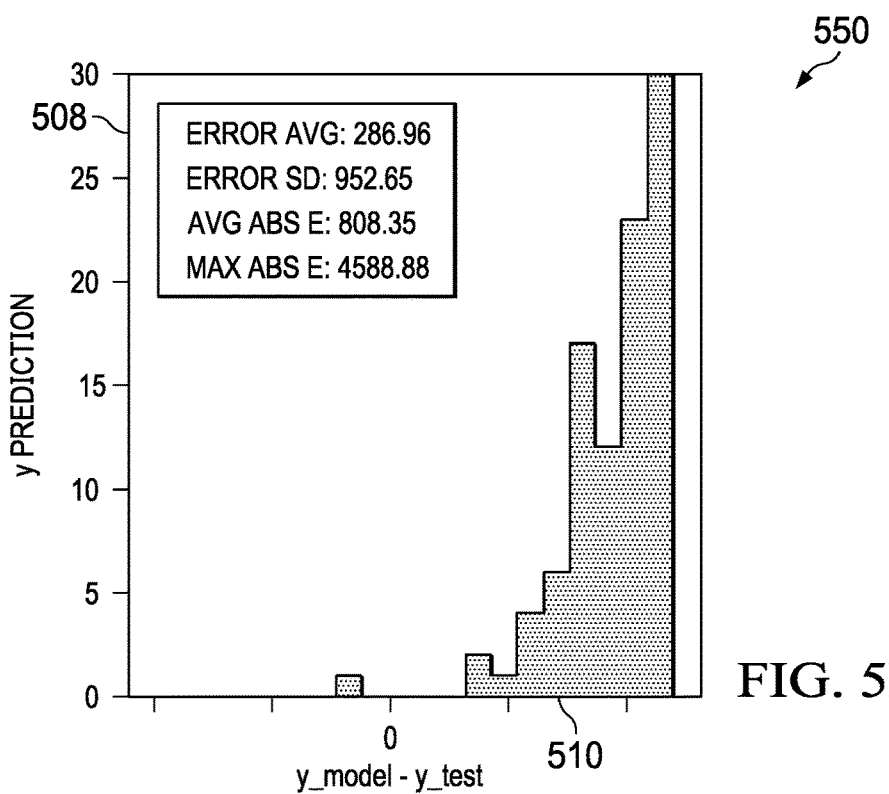

FIGS. 5A and 5B are graphs providing examples of prediction quality, according to some implementations of the present disclosure. The graphs are based on blind tests for water reduction (using randomly selected samples). Referring to FIG. 5A, model prediction points 502 are plotted relative to a perfect prediction line 504. The graphs are plotted relative to a "y in test" axis 506 and a y prediction 508. In the bar chart of FIG. 5B, bars representing differences 510 of y_model=y_test are graphed relative to the y_prediction axis 508.

Figure 6:
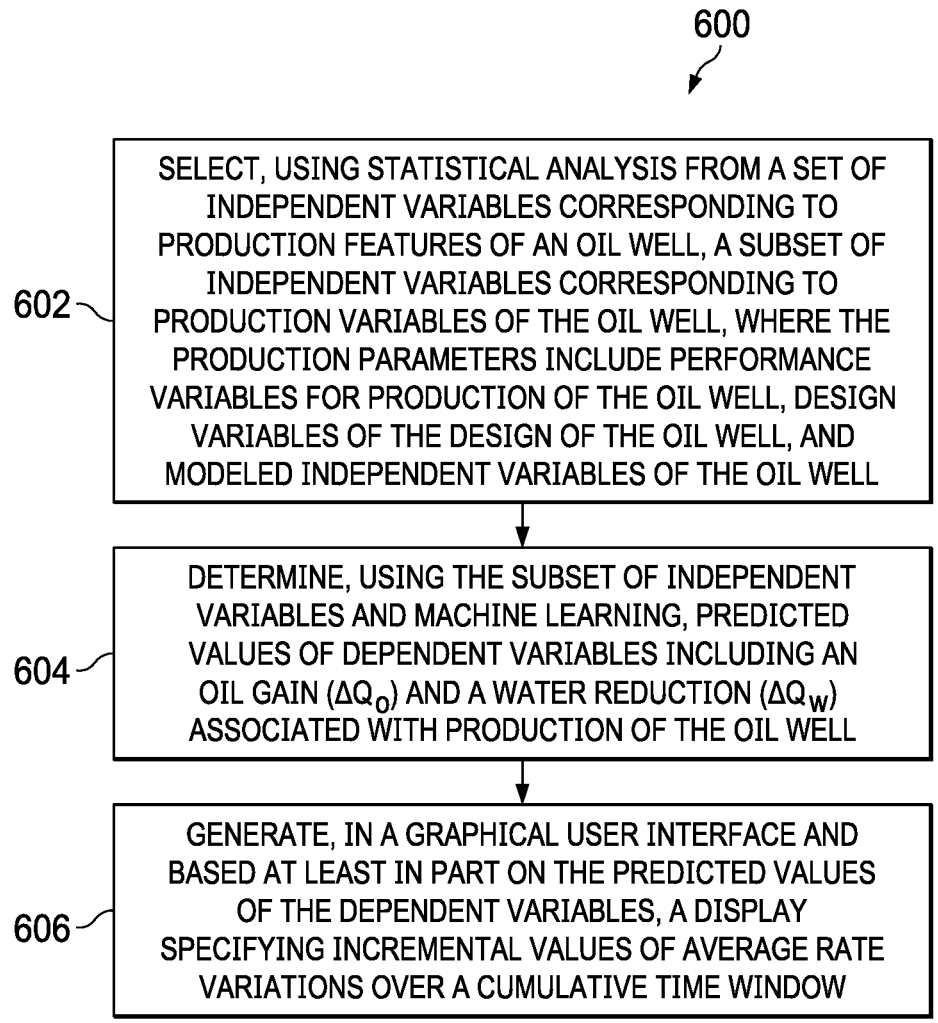
FIG. 6 is a flowchart of an example of a method for predicting oil gains and water reduction and displaying specifying incremental values of average rate variations over a cumulative time window, according to some implementations of the present disclosure.

FIG. 6 is a flowchart of an example of a method 600 predicting oil gains and water reduction and displaying specifying incremental values of average rate variations over a cumulative time window, according to some implementations of the present disclosure. For clarity of presentation, the description that follows generally describes method 600 in the context of the other figures in this description. However, it will be understood that method 600 can be performed, for example, by any suitable system, environment, software, and hardware, or a combination of systems, environments, software, and hardware, as appropriate. In some implementations, various steps of method 600 can be run in parallel, in combination, in loops, or in any order.

At 602, a subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. The performance variables selected in the subset of independent variables can include, for example, a liquid rate prior, a watercut prior sidetrack (ST), a cumulative water prior to sidetrack, a cumulative oil prior to sidetrack, an oil rate prior, an uptime prior, a choke size post, a decline rate prior, and a static pressure prior. The design variables selected in the subset of independent variables can include, for example, a Y-coordinate, an offset well head (WH) to true depth (TD), a distance to flank, a partial penetration, a lowest z deviation survey, a start to (ST) completion length, an azimuth, a field number, a completion type, a well density, and a year in which the sidetrack is performed. The modeled independent variables selected in the subset of independent variables can include, for example, an initial oil thickness, a Kóczy-Hirota (KH) interpolation, a height above initial free water level (HAFWL), a top reservoir, and an original free water level (FWL). From 602, method 600 proceeds to 604.

At 604, using the subset of independent variables and machine learning, predicted values of dependent variables are determined including an oil gain ($\Delta Q_o$) and a water reduction ($\Delta Q_w$) associated with production of the oil well. The predicted oil gains are described as the average rate increase (incremental to prior rate) for the period it takes for the well to produce 0.5 MMstb (million stock tank barrels). The same can be applied to the water variation predicted. It is the change in rate experienced by the well after being sidetracked for a cumulative of 0.5 mMstb. From 604, method 600 proceeds to 606.

At 606, a display specifying incremental values of average rate variations over a cumulative time window is generated in a graphical user interface. The display is based at least in part on the predicted values of dependent variables. After 606, method 600 can stop.

In some implementations, an oil-gain prediction quality is generated in a graphical user interface based, at least in part, on the predicted values of dependent variables. As an example, graphs can be generated that provide plots of oil gain prediction quality can include model prediction points plotted relative to a perfect prediction line.

In some implementations, graphs of water-reduction prediction quality are generated in the graphical user interface. For example, the graphs providing plots of water reduction prediction quality can include model prediction points plotted relative to a perfect prediction line.

Figure 7:
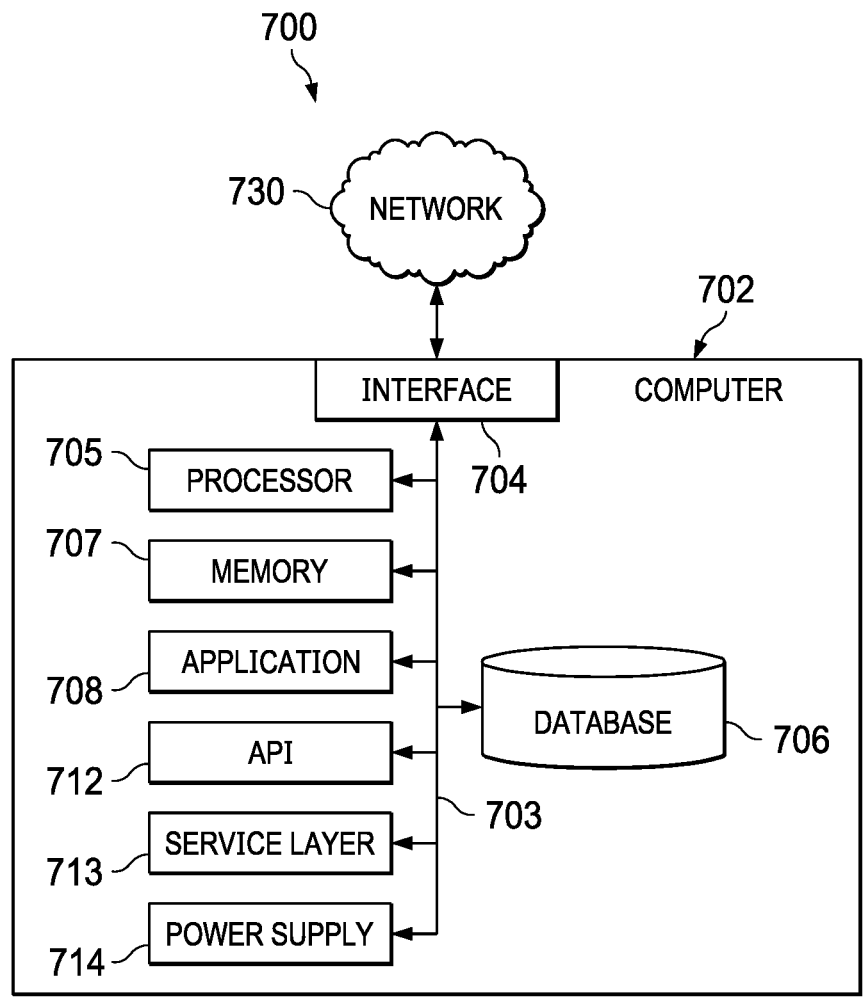
FIG. 7 is a block diagram illustrating an example computer system used to provide computational functionalities associated with described algorithms, methods, functions, processes, flows, and procedures as described in the present disclosure, according to some implementations of the present disclosure.

FIG. 7 is a block diagram of an example computer system 700 used to provide computational functionalities associated with described algorithms, methods, functions, processes, flows, and procedures described in the present disclosure, according to some implementations of the present disclosure. The illustrated computer 702 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 702 can include input devices such as keypads, keyboards, and touch screens that can accept user information. Also, the computer 702 can include output devices that can convey information associated with the operation of the computer 702. The information can include digital data, visual data, audio information, or a combination of information. The information can be presented in a graphical user interface (UI) (or GUI).

The computer 702 can serve in a role as a client, a network component, a server, a database, a persistency, or components of a computer system for performing the subject matter described in the present disclosure. The illustrated computer 702 is communicably coupled with a network 730. In some implementations, one or more components of the computer 702 can be configured to operate within different environments, including cloud-computing-based environments, local environments, global environments, and combinations of environments.

At a top level, the computer 702 is an electronic computing device operable to receive, transmit, process, store, and manage data and information associated with the described subject matter. According to some implementations, the computer 702 can also include, or be communicably coupled with, an application server, an email server, a web server, a caching server, a streaming data server, or a combination of servers.

The computer 702 can receive requests over network 730 from a client application (for example, executing on another computer 702). The computer 702 can respond to the received requests by processing the received requests using software applications. Requests can also be sent to the computer 702 from internal users (for example, from a command console), external (or third) parties, automated applications, entities, individuals, systems, and computers.

Each of the components of the computer 702 can communicate using a system bus 703. In some implementations, any or all of the components of the computer 702, including hardware or software components, can interface with each other or the interface 704 (or a combination of both) over the system bus 703. Interfaces can use an application programming interface (API) 712, a service layer 713, or a combination of the API 712 and service layer 713. The API 712 can include specifications for routines, data structures, and object classes. The API 712 can be either computer-language independent or dependent. The API 712 can refer to a complete interface, a single function, or a set of APIs.

The service layer 713 can provide software services to the computer 702 and other components (whether illustrated or not) that are communicably coupled to the computer 702. The functionality of the computer 702 can be accessible for all service consumers using this service layer. Software services, such as those provided by the service layer 713, can provide reusable, defined functionalities through a defined interface. For example, the interface can be software written in JAVA, C++, or a language providing data in extensible markup language (XML) format. While illustrated as an integrated component of the computer 702, in alternative implementations, the API 712 or the service layer 713 can be stand-alone components in relation to other components of the computer 702 and other components communicably coupled to the computer 702. Moreover, any or all parts of the API 712 or the service layer 713 can be implemented as child or sub-modules of another software module, enterprise application, or hardware module without departing from the scope of the present disclosure.

The computer 702 includes an interface 704. Although illustrated as a single interface 704 in FIG. 7, two or more interfaces 704 can be used according to particular needs, desires, or particular implementations of the computer 702 and the described functionality. The interface 704 can be used by the computer 702 for communicating with other systems that are connected to the network 730 (whether illustrated or not) in a distributed environment. Generally, the interface 704 can include, or be implemented using, logic encoded in software or hardware (or a combination of software and hardware) operable to communicate with the network 730. More specifically, the interface 704 can include software supporting one or more communication protocols associated with communications. As such, the network 730 or the interface's hardware can be operable to communicate physical signals within and outside of the illustrated computer 702.

The computer 702 includes a processor 705. Although illustrated as a single processor 705 in FIG. 7, two or more processors 705 can be used according to particular needs, desires, or particular implementations of the computer 702 and the described functionality. Generally, the processor 705 can execute instructions and can manipulate data to perform the operations of the computer 702, including operations using algorithms, methods, functions, processes, flows, and procedures as described in the present disclosure.

The computer 702 also includes a database 706 that can hold data for the computer 702 and other components connected to the network 730 (whether illustrated or not). For example, database 706 can be an in-memory, conventional, or a database storing data consistent with the present disclosure. In some implementations, database 706 can be a combination of two or more different database types (for example, hybrid in-memory and conventional databases) according to particular needs, desires, or particular implementations of the computer 702 and the described functionality. Although illustrated as a single database 706 in FIG. 7, two or more databases (of the same, different, or combination of types) can be used according to particular needs, desires, or particular implementations of the computer 702 and the described functionality. While database 706 is illustrated as an internal component of the computer 702, in alternative implementations, database 706 can be external to the computer 702.

The computer 702 also includes a memory 707 that can hold data for the computer 702 or a combination of components connected to the network 730 (whether illustrated or not). Memory 707 can store any data consistent with the present disclosure. In some implementations, memory 707 can be a combination of two or more different types of memory (for example, a combination of semiconductor and magnetic storage) according to particular needs, desires, or particular implementations of the computer 702 and the described functionality. Although illustrated as a single memory 707 in FIG. 7, two or more memories 707 (of the same, different, or combination of types) can be used according to particular needs, desires, or particular implementations of the computer 702 and the described functionality. While memory 707 is illustrated as an internal component of the computer 702, in alternative implementations, memory 707 can be external to the computer 702.

The application 708 can be an algorithmic software engine providing functionality according to particular needs, desires, or particular implementations of the computer 702 and the described functionality. For example, application 708 can serve as one or more components, modules, or applications. Further, although illustrated as a single application 708, the application 708 can be implemented as multiple applications 708 on the computer 702. In addition, although illustrated as internal to the computer 702, in alternative implementations, the application 708 can be external to the computer 702.

The computer 702 can also include a power supply 714. The power supply 714 can include a rechargeable or non-rechargeable battery that can be configured to be either user- or non-user-replaceable. In some implementations, the power supply 714 can include power-conversion and management circuits, including recharging, standby, and power management functionalities. In some implementations, the power-supply 714 can include a power plug to allow the computer 702 to be plugged into a wall socket or a power source to, for example, power the computer 702 or recharge a rechargeable battery.

There can be any number of computers 702 associated with, or external to, a computer system containing computer 702, with each computer 702 communicating over network 730. Further, the terms "client," "user," and other appropriate terminology can be used interchangeably, as appropriate, without departing from the scope of the present disclosure. Moreover, the present disclosure contemplates that many users can use one computer 702 and one user can use multiple computers 702.

Described implementations of the subject matter can include one or more features, alone or in combination.

For example, in a first implementation, a computer-implemented method includes the following. A subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. Using the subset of independent variables and machine learning, predicted values of dependent variables are determined including an oil gain ($\Delta Q_o$) and a water reduction ($\Delta Q_w$) associated with production of the oil well. A display specifying incremental values of average rate variations over a cumulative time window is generated in a graphical user interface. The display is based at least in part on the predicted values of dependent variables.

The foregoing and other described implementations can each, optionally, include one or more of the following features:

A first feature, combinable with any of the following features, where the performance variables selected in the subset of independent variables include: a liquid rate prior, a watercut prior sidetrack (ST), a cumulative water prior to sidetrack, a cumulative oil prior to sidetrack, an oil rate prior, an uptime prior, a choke size post, a decline rate prior, and a static pressure prior.

A second feature, combinable with any of the previous or following features, where the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which the sidetrack is performed.

A third feature, combinable with any of the previous or following features, where the modeled independent variables selected in the subset of independent variables include: an initial oil thickness, a Kóczy-Hirota (KH) interpolation, a height above initial free water level (HAFWL), a top reservoir, and an original free water level (FWL).

A fourth feature, combinable with any of the previous or following features, where the graphs providing plots of oil gain prediction quality include model prediction points plotted relative to a perfect prediction line.

A fifth feature, combinable with any of the previous or following features, where the graphs providing plots of water reduction prediction quality include model prediction points plotted relative to a perfect prediction line.

A sixth feature, combinable with any of the previous or following features, where the average rate variations are measured in millions of barrels per day over the cumulative time window.

In a second implementation, a non-transitory, computer-readable medium stores one or more instructions executable by a computer system to perform operations including the following. A subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. Using the subset of independent variables and machine learning, predicted values of dependent variables are determined including an oil gain ($\Delta Q_o$) and a water reduction ($\Delta Q_w$) associated with production of the oil well. A display specifying incremental values of average rate variations over a cumulative time window is generated in a graphical user interface. The display is based at least in part on the predicted values of dependent variables.

The foregoing and other described implementations can each, optionally, include one or more of the following features:

A first feature, combinable with any of the following features, where the performance variables selected in the subset of independent variables include: a liquid rate prior, a watercut prior sidetrack (ST), a cumulative water prior to sidetrack, a cumulative oil prior to sidetrack, an oil rate prior, an uptime prior, a choke size post, a decline rate prior, and a static pressure prior.

A second feature, combinable with any of the previous or following features, where the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which the sidetrack is performed.

A third feature, combinable with any of the previous or following features, where the modeled independent variables selected in the subset of independent variables include: an initial oil thickness, a Kóczy-Hirota (KH) interpolation, a height above initial free water level (HAFWL), a top reservoir, and an original free water level (FWL).

A fourth feature, combinable with any of the previous or following features, where the graphs providing plots of oil gain prediction quality include model prediction points plotted relative to a perfect prediction line.

A fifth feature, combinable with any of the previous or following features, where the graphs providing plots of water reduction prediction quality include model prediction points plotted relative to a perfect prediction line.

A sixth feature, combinable with any of the previous or following features, where the average rate variations are measured in millions of barrels per day over the cumulative time window.

In a third implementation, a computer-implemented system includes one or more processors and a non-transitory computer-readable storage medium coupled to the one or more processors and storing programming instructions for execution by the one or more processors. The programming instructions instruct the one or more processors to perform operations including the following. A subset of independent variables corresponding to production variables of the oil well are selected using statistical analysis from a set of independent variables corresponding to production features of an oil well. The production parameters include performance variables for production of the oil well, design variables of the design of the oil well, and modeled independent variables of the oil well. Using the subset of independent variables and machine learning, predicted values of dependent variables are determined including an oil gain ($\Delta Q_o$) and a water reduction ($\Delta Q_w$) associated with production of the oil well. A display specifying incremental values of average rate variations over a cumulative time window is generated in a graphical user interface. The display is based at least in part on the predicted values of dependent variables.

The foregoing and other described implementations can each, optionally, include one or more of the following features:

A first feature, combinable with any of the following features, where the performance variables selected in the subset of independent variables include: a liquid rate prior, a watercut prior sidetrack (ST), a cumulative water prior to sidetrack, a cumulative oil prior to sidetrack, an oil rate prior, an uptime prior, a choke size post, a decline rate prior, and a static pressure prior.

A second feature, combinable with any of the previous or following features, where the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which the sidetrack is performed.

A third feature, combinable with any of the previous or following features, where the modeled independent variables selected in the subset of independent variables include: an initial oil thickness, a Kóczy-Hirota (KH) interpolation, a height above initial free water level (HAFWL), a top reservoir, and an original free water level (FWL).

A fourth feature, combinable with any of the previous or following features, where the graphs providing plots of oil gain prediction quality include model prediction points plotted relative to a perfect prediction line.

A fifth feature, combinable with any of the previous or following features, where the graphs providing plots of water reduction prediction quality include model prediction points plotted relative to a perfect prediction line.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure.

Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
    selecting, using statistical analysis from a set of independent variables corresponding to production features of an oil well in a reservoir, a subset of independent variables corresponding to production variables of the oil well, wherein the production variables include performance variables for production of the oil well, design variables of a design of the oil well, and modeled independent variables of the oil well;
    training, using historical records of sidetracks from producer wells, a sidetrack performance prediction model configured to use the modeled independent variables to predict a performance of future sidetracks;
    determining, using the subset of independent variables and machine learning, predicted values of dependent variables including an oil gain ($\Delta Q_o$) and a water reduction ($\Delta Q_w$) associated with production of the oil well;
    predicting, as predicted oil gains by using the sidetrack performance prediction model, oil gains derived from horizontal sidetracking of producer wells using past production performance, subsurface information, and sidetrack design parameters;
    generating, in a graphical user interface and based at least in part on the predicted values of dependent variables and predicted oil gains in a producer well in the reservoir that is re-purposed in the reservoir, a display specifying incremental values of average rate variations over a cumulative time window; and
    re-purposing, based at least on the sidetrack design parameters, the producer well in the reservoir to access new sections of the reservoir to recover further hydrocarbons from the reservoir.

2. The computer-implemented method of claim 1, wherein the performance variables selected in the subset of independent variables include: a liquid rate prior, a watercut prior to a sidetrack (ST), a cumulative water prior to the sidetrack, a cumulative oil prior to the sidetrack, an oil rate prior to the ST, an uptime prior to the ST, a choke size post, a decline rate prior to the ST, and a static pressure prior to the ST.

3. The computer-implemented method of claim 1, wherein the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which a sidetrack is performed.

4. The computer-implemented method of claim 1, wherein the modeled independent variables selected in the subset of independent variables include: an initial oil thickness, a Kóczy-Hirota (KH) interpolation, a height above initial free water level (HAFWL), a top reservoir, and an original free water level (FWL).

5. The computer-implemented method of claim 1, wherein the display includes graphs providing plots of oil gain prediction quality including model prediction points plotted relative to a perfect prediction line.

6. The computer-implemented method of claim 1, wherein the display includes graphs providing plots of water reduction prediction quality including model prediction points plotted relative to a perfect prediction line.

7. The computer-implemented method of claim 1, wherein the average rate variations are measured in millions of barrels per day over the cumulative time window.

8. A non-transitory, computer-readable medium storing one or more instructions executable by a computer system to perform operations comprising:
selecting, using statistical analysis from a set of independent variables corresponding to production features of an oil well in a reservoir, a subset of independent variables corresponding to production variables of the oil well, wherein the production variables include performance variables for production of the oil well, design variables of a design of the oil well, and modeled independent variables of the oil well;
training, using historical records of sidetracks from producer wells, a sidetrack performance prediction model configured to use the modeled independent variables to predict a performance of future sidetracks;
determining, using the subset of independent variables and machine learning, predicted values of dependent variables including an oil gain ($\Delta Q_o$) and a water reduction ($\Delta Q_w$) associated with production of the oil well;
predicting, as predicted oil gains by using the sidetrack performance prediction model, oil gains derived from horizontal sidetracking of producer wells using past production performance, subsurface information, and sidetrack design parameters;
generating, in a graphical user interface and based at least in part on the predicted values of dependent variables and predicted oil gains in a producer well in the reservoir that is re-purposed in the reservoir, a display specifying incremental values of average rate variations over a cumulative time window; and
re-purposing, based at least on the sidetrack design parameters, the producer well in the reservoir to access new sections of the reservoir to recover further hydrocarbons from the reservoir.

9. The non-transitory, computer-readable medium of claim 8, wherein the performance variables selected in the subset of independent variables include: a liquid rate prior, a watercut prior to a sidetrack (ST), a cumulative water prior to the sidetrack, a cumulative oil prior to the sidetrack, an oil rate prior to the ST, an uptime prior to the ST, a choke size post, a decline rate prior to the ST, and a static pressure prior to the ST.

10. The non-transitory, computer-readable medium of claim 8, wherein the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which a sidetrack is performed.

11. The non-transitory, computer-readable medium of claim 8, wherein the modeled independent variables selected in the subset of independent variables include: an initial oil thickness, a Kóczy-Hirota (KH) interpolation, a height above initial free water level (HAFWL), a top reservoir, and an original free water level (FWL).

12. The non-transitory, computer-readable medium of claim 8, wherein the display includes graphs providing plots of oil gain prediction quality including model prediction points plotted relative to a perfect prediction line.

13. The non-transitory, computer-readable medium of claim 8, wherein the display includes graphs providing plots of water reduction prediction quality including model prediction points plotted relative to a perfect prediction line.

14. The non-transitory, computer-readable medium of claim 8, wherein the average rate variations are measured in millions of barrels per day over the cumulative time window.

15. A computer-implemented system, comprising:
one or more processors; and
a non-transitory computer-readable storage medium coupled to the one or more processors and storing programming instructions for execution by the one or more processors, the programming instructions instructing the one or more processors to perform operations comprising:
selecting, using statistical analysis from a set of independent variables corresponding to production features of an oil well in a reservoir, a subset of independent variables corresponding to production variables of the oil well, wherein the production variables include performance variables for production of the oil well, design variables of a design of the oil well, and modeled independent variables of the oil well;
training, using historical records of sidetracks from producer wells, a sidetrack performance prediction model configured to use the modeled independent variables to predict a performance of future sidetracks;
determining, using the subset of independent variables and machine learning, predicted values of dependent variables including an oil gain ($\Delta Q_o$) and a water reduction ($\Delta Q_w$) associated with production of the oil well;
predicting, as predicted oil gains by using the sidetrack performance prediction model, oil gains derived from horizontal sidetracking of producer wells using past production performance, subsurface information, and sidetrack design parameters;
generating, in a graphical user interface and based at least in part on the predicted values of dependent variables and predicted oil gains in a producer well in the reservoir that is re-purposed in the reservoir, a display specifying incremental values of average rate variations over a cumulative time window; and
re-purposing, based at least on the sidetrack design parameters, the producer well in the reservoir to access new sections of the reservoir to recover further hydrocarbons from the reservoir.

16. The computer-implemented system of claim 15, wherein the performance variables selected in the subset of independent variables include: a liquid rate prior, a watercut prior to a sidetrack (ST), a cumulative water prior to the sidetrack, a cumulative oil prior to the sidetrack, an oil rate prior to the ST, an uptime prior to the ST, a choke size post, a decline rate prior to the ST, and a static pressure prior to the ST.

17. The computer-implemented system of claim 15, wherein the design variables selected in the subset of independent variables include: a Y-coordinate, an offset well head (WH) to true depth (TD), a distance to flank, a partial penetration, a lowest z deviation survey, a start to (ST) completion length, an azimuth, a field number, a completion type, a well density, and a year in which a sidetrack is performed.

18. The computer-implemented system of claim 15, wherein the modeled independent variables selected in the subset of independent variables include: an initial oil thickness, a Kóczy-Hirota (KH) interpolation, a height above initial free water level (HAFWL), a top reservoir, and an original free water level (FWL).

19. The computer-implemented system of claim 15, wherein the display includes graphs providing plots of oil gain prediction quality including model prediction points plotted relative to a perfect prediction line.

20. The computer-implemented system of claim 15, wherein the display includes graphs providing plots of water reduction prediction quality including model prediction points plotted relative to a perfect prediction line.

* * * * *